(12) United States Patent
Dijken et al.

(10) Patent No.: US 9,658,520 B2
(45) Date of Patent: May 23, 2017

(54) WAVELENGTH CONVERTING ELEMENT COMPRISING CERAMIC CAPSULE

(71) Applicant: KONINKLIJKE PHILIPS N.V., Eindhoven (NL)

(72) Inventors: Durandus Kornelius Dijken, Eindhoven (NL); Dominique Maria Bruls, Eindhoven (NL); Martin Hillebrand Blees, Eindhoven (NL); Rifat Ata Mustafa Hikmet, Eindhoven (NL); Hendrik Johannes Boudewijn Jagt, Eindhoven (NL); Loes Johanna Mathilda Koopmans, Eindhoven (NL); Manuela Lunz, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 15 days.

(21) Appl. No.: 14/432,217

(22) PCT Filed: Sep. 25, 2013

(86) PCT No.: PCT/IB2013/058839
§ 371 (c)(1),
(2) Date: Mar. 30, 2015

(87) PCT Pub. No.: WO2014/053951
PCT Pub. Date: Apr. 10, 2014

(65) Prior Publication Data
US 2015/0261076 A1 Sep. 17, 2015

Related U.S. Application Data

(60) Provisional application No. 61/708,080, filed on Oct. 1, 2012.

(51) Int. Cl.
*G03B 21/20* (2006.01)
*G02B 26/00* (2006.01)
(Continued)

(52) U.S. Cl.
CPC .............. *G03B 21/204* (2013.01); *F21V 9/16* (2013.01); *G02B 26/008* (2013.01);
(Continued)

(58) Field of Classification Search
None
See application file for complete search history.

(56) References Cited

U.S. PATENT DOCUMENTS 5,376,606 A 12/1994 Kim et al.
7,372,033 B1 5/2008 Stevens
(Continued)

FOREIGN PATENT DOCUMENTS

| CN | 202275207 U | * | 6/2012 |
| GB | 2071073 A | | 9/1981 |
| WO | 2011123987 | | 10/2011 |

OTHER PUBLICATIONS

The machine translation of CN202275207U reference, Yang et al, Jun. 13, 2012.*

(Continued)

*Primary Examiner* — Hemang Sanghavi
(74) *Attorney, Agent, or Firm* — Brian D. Ogonowsky; Patent Law Group LLP

(57) ABSTRACT

A wavelength converting member is provided, comprising a sealed capsule at least partly made of sintered polycrystalline ceramic, for example sintered polycrystalline alumina, said capsule defining at least one sealed cavity; and—a wavelength converting material contained within said sealed cavity. The wavelength converting member has high total forward transmission of light, high thermal conductivity, high strength and provides excellent protection for the wavelength converting member against oxygen and water. The wavelength converting member can advantageously be applied in a light emitting arrangement or as a color wheel for a digital image projector.

10 Claims, 4 Drawing Sheets

(51) Int. Cl.
  *F21V 9/16*   (2006.01)
  *H01L 25/075*   (2006.01)
  *H01L 33/50*   (2010.01)
  *F21L 4/02*   (2006.01)
  *B82Y 20/00*   (2011.01)
  *F21K 9/64*   (2016.01)
  *F21Y 115/30*   (2016.01)
  *F21Y 115/10*   (2016.01)

(52) U.S. Cl.
  CPC ........ *H01L 25/0753* (2013.01); *H01L 33/507* (2013.01); *B82Y 20/00* (2013.01); *F21K 9/64* (2016.08); *F21L 4/027* (2013.01); *F21Y 2115/10* (2016.08); *F21Y 2115/30* (2016.08); *H01L 33/501* (2013.01); *H01L 33/502* (2013.01); *H01L 2924/0002* (2013.01); *H01L 2933/0041* (2013.01); *Y10S 977/774* (2013.01)

(56) References Cited

U.S. PATENT DOCUMENTS

| | | | |
|---|---|---|---|
| 2004/0257797 A1* | 12/2004 | Suehiro | H01L 33/507 362/34 |
| 2007/0273274 A1 | 11/2007 | Horiuchi et al. | |
| 2010/0103648 A1 | 4/2010 | Kim et al. | |
| 2011/0156072 A1* | 6/2011 | Ling | H01L 33/507 257/98 |
| 2012/0014086 A1 | 1/2012 | Jonsson | |
| 2012/0068213 A1* | 3/2012 | Zhang | B32B 18/00 257/98 |
| 2012/0068630 A1 | 3/2012 | Li | |
| 2012/0087124 A1 | 4/2012 | Ravillisetty et al. | |
| 2012/0113671 A1 | 5/2012 | Sadasivan | |
| 2012/0113672 A1* | 5/2012 | Dubrow | B82Y 20/00 362/602 |
| 2012/0120120 A1 | 5/2012 | Li | |
| 2012/0201030 A1* | 8/2012 | Yuan | G02B 26/008 362/293 |
| 2012/0236587 A1* | 9/2012 | Kim | B23K 26/0604 362/602 |

OTHER PUBLICATIONS

"Characterization of Second Phases in Translucent Alumina by Analytical Transmission Electron Microscopy" Wei et al, in Ceramic Microstructures Control at the Atomic Level, Jan. 1, 1998, Plenum Press. p. 311-314, 317-320.

"Grain Boundary Chemistry and Creep Resistance of Alumina" Li et al, in Ceramic Mictrostructures Control at the Atomic Level, Jan. 1, 1998, Plenum Press. p. 215-820.

* cited by examiner

WAVELENGTH CONVERTING ELEMENT COMPRISING CERAMIC CAPSULE

CROSS-REFERENCE TO PRIOR APPLICATIONS

This application is the U.S. National Phase application under 35 U.S.C. §371 of International Application No. PCT/IB2013/058839, filed on Sep. 15, 2013, which claims the benefit of U.S. patent application Ser. No. 61/708,080, filed on Oct. 1, 2012. These applications are hereby incorporated by reference herein.

FIELD OF THE INVENTION

The present invention relates to a wavelength converting element comprising a sealed ceramic capsule containing wavelength converting material, and to the use of such wavelength converting elements in a solid-state light emitting arrangement and/or as a color wheel for a digital image projector.

BACKGROUND OF THE INVENTION

Light-emitting diode (LED) based illumination devices are increasingly used for a wide variety of lighting applications. LEDs offer advantages over traditional light sources, such as incandescent and fluorescent lamps, including long lifetime, high lumen efficacy, low operating voltage and fast modulation of lumen output.

Efficient high-power LEDs are often based on blue light emitting materials. To produce an LED based illumination device having a desired color (e.g., white) output, a suitable wavelength converting material, commonly known as a phosphor, may be used which converts part of the light emitted by the LED into light of longer wavelengths so as to produce a combination of light having desired spectral characteristics. The wavelength converting material may be applied directly on the LED die, or it may be arranged at a certain distance from the phosphor (so-called remote configuration).

Many inorganic materials have been used as phosphor materials for wavelength conversion. However, many inorganic phosphors, in particular red phosphors, suffer from the disadvantage that the conversion spectrum peak is relatively wide, and that a large amount of infrared or near-infrared light is generated, to which the human eye has low or no sensitivity. Another important disadvantage of many conventional phosphors is the relatively large Stokes' loss (the energy difference between the absorbed wavelength and the emitted wavelengths). The Stokes' loss, but also the emission of infra-red wavelengths, may cause problems with regard to thermal management, since heat absorbed by the phosphor must be carried off in order to avoid degeneration and thermal quenching of the wavelength converting material.

In order to avoid generation of large amount of infra-red radiation, the use of red quantum dots has been proposed. Quantum dots have a narrow conversion (emission) peak and do not produce infrared light, which increases the efficiency of an LED based device. However, quantum dots, which are usually provided in a transparent matrix of silicone or acrylic polymer, are highly sensitive to oxidation, and must therefore be protected from oxygen and water in order to avoid degradation.

US 2012/0113672 discloses quantum dot encapsulation and matrix materials, including quantum dot films with protective barriers. However, a general problem with various known encapsulations is that the barrier material either has undesirably low light transmission, which reduces the device efficiency, or that the barrier materials are highly expensive, which effectively prevents their use in many applications.

SUMMARY OF THE INVENTION

It is an object of the present invention to at least partly overcome these problems, and to provide a wavelength converting member which effectively prevents degradation of an oxidation-sensitive wavelength converting material, and which is improved in terms of light transmission and/or cost-efficiency.

According to a first aspect of the invention, this and other objects are achieved by a wavelength converting member comprising
  a sealed capsule at least partly made of sintered polycrystalline ceramic, for example sintered polycrystalline alumina, said capsule defining at least one sealed cavity; and
  a wavelength converting material contained within said sealed cavity.

The use of polycrystalline ceramic, in particular polycrystalline alumina, is advantageous since it is more cost-efficient than e.g. sapphire, while still having a high total forward transmission of light (TFT), typically at least 75%, and low light absorption. The polycrystalline ceramic capsule also has high thermal conductivity, high strength, and can be hermetically sealed to protect the wavelength converting material from degradation by water or oxygen. The thermal conductivity of a polycrystalline alumina may have a thermal conductivity of e.g. 30-40 W/mK, which may help to keep the wavelength converting material sufficiently cool (e.g. below 100° C.) to prevent thermal ageing. With respect to mechanical strength, a capsule made of polycrystalline ceramic may withstand internal gas pressures of at least 20 bar.

In embodiments on the invention, the polycrystalline ceramic may be doped with $ZrO_2$ and/or $MgO$. Doping may contribute to increased light transmission. For example, a polycrystalline alumina plate doped with $ZrO_2$ and/or $MgO$ may have a TFT higher than 80%, e.g. 82%.

In embodiments of the invention, the polycrystalline ceramic may have an average grain size in the range of from 0.3 to 150 μm, for example from 10 to 60 μm, such as from 15 to 30 μm.

The polycrystalline ceramic, and in particular polycrystalline alumina, used for the capsule may have a total forward hemispherical transmission for wavelengths in the range of from 400 to 700 nm of at least 80%, as measured in air.

Typically, the sealed capsule may comprise a first portion and a second portion, wherein at least one of said first portion and second portion is made of said sintered polycrystalline ceramic. For instance, at least one of said bottom portion and said top portion may comprise at least one sintered polycrystalline ceramic material selected from the group consisting of sintered spinel, yttrium aluminum garnet (YAG) and AlON.

Furthermore, said capsule typically comprises an opening for accessing the cavity before sealing thereof, said opening being sealed by a sealing material. At least one of said bottom portion and said top portion may be at least partially transparent or translucent. Optionally, one of said bottom portion and said top portion may be reflective.

The sealing material may be selected from the group consisting of epoxy, glass frit (typically low melting glass frit), alumina, and metal (typically low melting metal). Advantageously, these materials have low gas permeability and/or no or low light absorption, and may be applied on a very small area using known techniques. According to embodiments of the invention, the sealed capsule may be hermetically or at least pseudo-hermetically sealed.

The wavelength converting member may have a flat shape, for example flat polygonal or disc-like shape, or a curved shape, depending on the intended application.

In embodiments of the invention, the wavelength converting material may comprise quantum dots. Quantum dots generally have a small Stokes' loss and narrow emission band, which means a reduced risk of overheating the phosphor. In other embodiments, the wavelength converting material may comprise an organic or inorganic wavelength converting material. Typically, the wavelength converting material may be mixed with a carrier material, for example an acrylic polymer or silicone. The carrier material is preferably transparent or translucent. The carrier material may be curable, for example UV curable.

In embodiments of the invention, the wavelength converting material and any carrier material may optionally not completely fill said sealed cavity. In other embodiments, the carrier material may comprise pores.

Furthermore, the wavelength converting member may comprise at least one spacer arranged within said sealed capsule. Optionally, said spacer may bridge the sealed cavity. Alternatively, at least one spacer may be arranged on one inner surface of capsule and protrude into the sealed cavity (not necessarily contacting the opposite inner surface of the capsule).

In embodiments of the invention, the wavelength converting material may further comprise a wavelength converting material, typically a conventional inorganic or organic wavelength converting material, arranged on an outer surface of said sealed capsule. Such an outer phosphor layer may be adapted to compensate for any non-uniformity of the converted light emitted by the wavelength converting material contained within the sealed cavity.

The wavelength converting member according to embodiments of the invention may form a wavelength converting window of high total forward transmission.

In embodiments of the invention, the sealed capsule may define a plurality of individual, sealed cavities, each comprising an opening for accessing the respective cavity before sealing of said opening, wherein said opening is sealed with a sealing material. For example, a first sealed cavity may comprise at least a first wavelength converting material and a second sealed cavity may comprise at least a second wavelength converting material. Optionally, at least one cavity may lack wavelength converting material. Hence, at least one of said sealed cavities comprises a wavelength converting material. A wavelength converting member defining a plurality of sealed cavities may be useful as a color wheel, e.g. for application in digital image projection.

Hence, in another aspect, the invention provides a color wheel comprising a wavelength converting member as described herein, typically a wavelength converting member comprising a plurality of cavity segments. The wavelength converting member of the color wheel is typically rotatable around a rotation axis (R) extending in the normal direction to the plane of the wavelength converting member.

In yet another aspect, the invention provides a light emitting arrangement comprising
- a solid state light source adapted to emit light of a first wavelength range; and
- a wavelength converting member as described herein arranged to receive light emitted by the solid state light source, wherein the wavelength converting material is adapted to convert light of said first wavelength range into a second wavelength range. The wavelength converting member may form a light exit window of the light emitting arrangement.

In a further aspect, the invention relates to a digital image projector comprising a color wheel or a light emitting arrangement as described herein.

It is noted that the invention relates to all possible combinations of features recited in the claims.

BRIEF DESCRIPTION OF THE DRAWINGS

These and other aspects of the present invention will now be described in more detail, with reference to the appended drawings showing embodiments of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
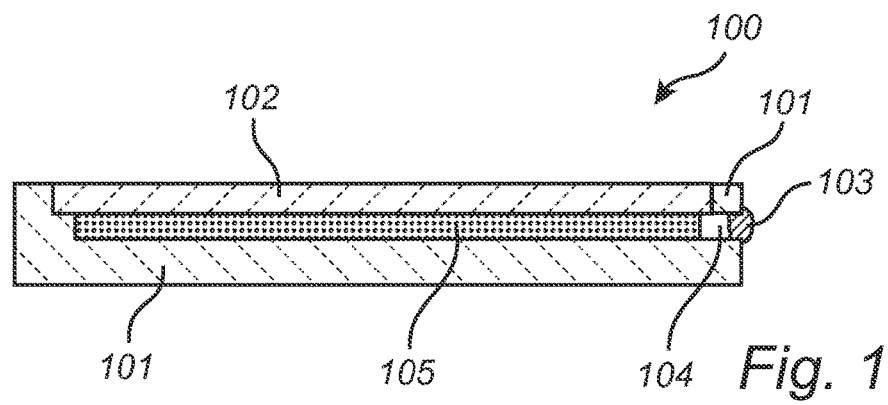
FIG. 1 shows a cross-sectional side view of a wavelength converting member according to embodiments of the invention.

FIG. 1 illustrates a wavelength converting member 100 according to embodiments of the invention. The wavelength converting member 100 comprises a sealed capsule made of two separate portions, a first or bottom portion 101 and a second or top portion 102. The portions 101, 102 are shaped to allow the formation of a cavity when they are aligned and joined together at their edges. To this end, the portion 101 may have a low wall, while the portion 102 may be flat. The cavity defined by the portions 101, 102 is occupied by a wavelength converting material 105. Typically, the wavelength converting material is introduced into the cavity (after joining of the two portions 101, 102 to form the capsule) via a hole 104 formed in the bottom portion 101, which after introduction of the wavelength converting material has been sealed by a seal 103. Hence, the wavelength converting member forms a sealed capsule containing the wavelength converting material.

The first portion 101 and/or the second portion 102 typically comprises a sintered polycrystalline ceramic, for example sintered polycrystalline alumina. Other ceramics that may be used for parts the first portion and/or the second portion include sintered spinel, yttrium aluminum garnet (YAG), or aluminium oxynitride (AlON), all of which are polycrystalline. It is also contemplated that one of the portions 101, 102 could be made of sapphire which is a single crystal material.

The hole 104 may be formed during manufacture of the portion 101, or it may be drilled or laser cut. Alternatively, to form the capsule, two individual plate-shaped portions may be joined by a joint applied along the circumference of at least one of the plate-shaped portions, but leaving a hole 104 at at least one position. In the embodiment shown in FIG. 1, the joint may be a polycrystalline ceramic of the same type as at least one of the portions 101, 102, so that after sintering the joint becomes integral with one or both of the portions 101, 102.

Alternatively, in some embodiments, a hole may be drilled or laser cut in either of the portions 101, 102.

Figure 2:
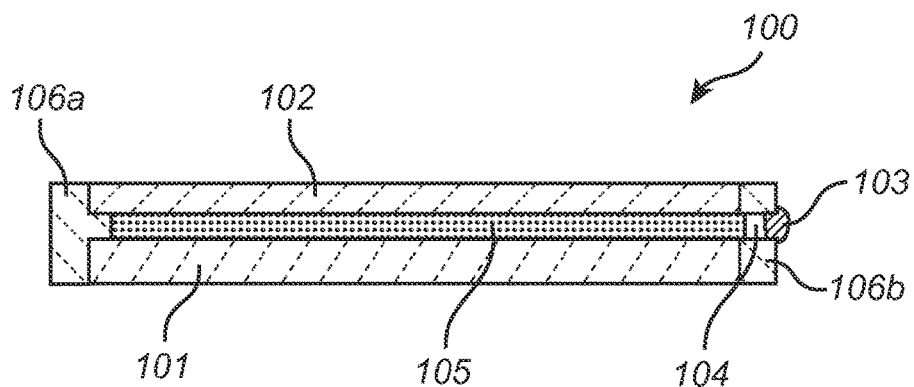
FIG. 2 shows a cross-sectional side view of a wavelength converting member according to other embodiments of the invention.

FIG. 2 shows a variation of the embodiment of FIG. 1. In FIG. 2, the portion 101 and the portion 102 are joined together by at least one third, lateral portion 106a-b. In the case of a circular (disc-shaped) wavelength converting member, the lateral portion may be a single portion. Alternatively, for example with a polygonal wavelength converting member, it is envisaged that there may be a plurality of lateral portions, for example three or four lateral portions. The lateral portion, or at least one of the lateral portions, as the case may be, has a through hole for introduction of the wavelength converting material into the cavity formed by joining the first portion 101, the second portion 102 and the lateral portion(s) 106a-b. The portions 101, 102, and 106a-b may be co-sintered to form the capsule.

Figure 3:
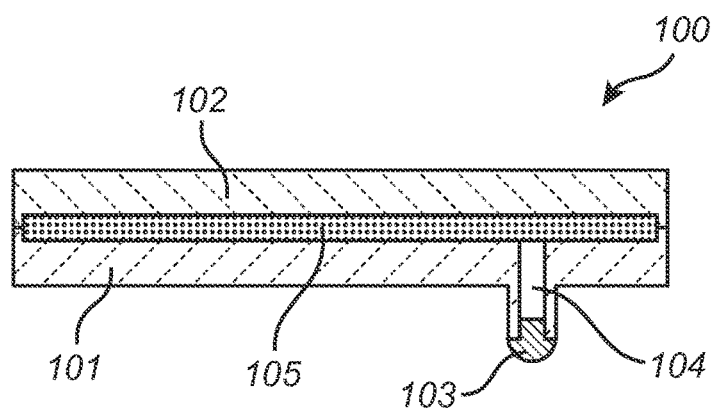
FIG. 3 shows a cross-sectional side view of a wavelength converting member according to other embodiments of the invention.

FIG. 3 illustrates yet another solution for forming the wavelength converting member 100. In this figure, the first, plate-shaped portion 101 has an opening 104 to allow introduction of the wavelength converting material 105. The portions may be co-sintered or joined by a joint. After introduction, the opening has been sealed by the seal 103.

As mentioned above, at least one of the first portion 101 and the second portion 102 may be made of sintered polycrystalline alumina. For example, a sintered polycrystalline alumina material as described in WO 03/059839 may be used. In some embodiments, the polycrystalline alumina may be doped with $ZrO_2$ and/or MgO. Optionally, one or more other rare earth oxide dopants may be used, typically in addition to said $ZrO_2$ and/or MgO. Such other suitable dopants include $Er_2O_3$, $La_2O_3$, $Lu_2O_3$, and $Yb_2O_3$. Doping may contribute to increased light transmission.

The polycrystalline alumina may have a porosity of less than 1% by volume, for example less than 0.1%, such as about 0.01% by volume. The low porosity results in very little back-scattering of light and thus high forward transmission of light.

The total forward transmission (TFT) of sapphire, measured in air, is 86%. 7% of the incident light is reflected back at the first interface (air/sapphire) and another 7% is reflected back at the second interface (sapphire/air). The TFT of sapphire is not dependent on the thickness of the sample, since it is very pure and solid material (no porosity). Ideally, the TFT of the sintered polycrystalline ceramic (typically alumina) used for the sealed capsule according to embodiments of the invention may be 86%. However, the TFT may be lower than 86%, since it is dependent on several other parameters: the porosity remaining after sintering (preferably less than 1%), the degree of contamination, e.g. by metals, which may absorb light, and the thickness of the capsule portions. In embodiments of the invention, the TFT of the sintered polycrystalline ceramic, typically polycrystalline alumina, may be at least 82% as measured in air with perpendicular light of 350-800 nm, for a polycrystalline ceramic sample of 1 mm thickness. For example, a polycrystalline alumina sample was found to have a TFT of about 84%. The TFT dependence on sample thickness may be roughly linear.

As used herein, by "transparent" is meant that a material has a total forward transmission of light (TFT) corresponding to at least 90%, preferably at least 95%, of the TFT of sapphire. Furthermore, by "translucent" is meant that most light is transmitted (excluding Fresnel reflection), but that in contrast to a transparent material, a translucent material deflects light over a certain angular range. According to embodiments of the invention, the polycrystalline ceramic used for at least one of the first and second portions of the capsule may have a total forward transmission of light (400-700 nm) of at least 70%, preferably at least 75%, for example at least 78%, such as at least 80% or even at least 82%.

The grain size of the polycrystalline alumina before sintering may be in the range of from 0.3 to 150 μm, for example from 10 to 60 μm, such as from 15 to 30 μm.

The portions 101, 102 and, where applicable, portion(s) 106a-b, may be formed by injection molding followed by sintering. Alternatively, the portions may be produced by one of the following techniques: gel casting, slip casting, uniaxial pressing, and extrusion. The cavity diameter may be in the range of from about 1 to 50 mm, depending on the intended use. For example, for a wavelength converting member intended as a light exit window in a vicinity LED module, the diameter of the cavity containing the wavelength converting material may be in the range of from 6 to 20 mm, while for a wavelength converting member intended as a light exit window in a remote LED module, the diameter of the cavity containing the wavelength converting material may be about 50 mm. The diameters of the individual portions 101, 102 will be about the same or larger compared to the diameter of the cavity containing the wavelength converting material. The thickness of the first and second portions 101, 102 may typically be in the range of from 0.3 to 1 mm. The thickness of the wavelength converting layer contained in the cavity may be for example from 30 to 500 μm. Hence, the cavity containing the wavelength converting material may be at least 30 μm. In some embodiments, the cavity may have a height exceeding the thickness of the layer of wavelength converting material.

In some embodiments it may be desirable to produce a capsule defining a cavity of different height at different positions, by making at least one of the portions 101, 102 with locally increased thickness. For example, the height of the cavity could be a function of the radius of the capsule. Variations in cavity height may result in variations in the amount or concentration of wavelength converting material, and could be utilized in order to achieve variations in e.g. color temperature. Alternatively, when intended for use in a light emitting arrangement, the cavity could have a lesser height at positions that are to be aligned with a light source, e.g. an LED, so as to contain a lesser the amount of wavelength converting material at these positions, which may reduce local temperature increases (hot spots) in the wavelength converting member. Capsule portions of uneven thickness may advantageously be manufactured by injection molding.

As mentioned above, the first and second portions may be joined by a joint (not shown in FIGS. 1-3). In some embodiments, the joint may be a polycrystalline ceramic, e.g. alumina powder, of the same type as at least one of the portions 101, 102, applied before the final sintering step, so that after sintering the joint becomes integral with one or both of the portions 101, 102. Alternatively, the joint may be glass frit, which may be used for joining two already sintered portions 101, 102. Alternatively, the green state joining may be performed by plastic welding techniques such as ultrasonic welding or hot gas welding and the like After forming the capsule by joining portions 101, 102 and where applicable any other portions such as lateral portion(s) 106a-b, the wavelength converting material may be introduced into the capsule via the opening 104. The wavelength converting material to be introduced is typically in a fluid state. The filling may be done using various methods, for example by capillary forces, by vacuum filling (e.g. at a pressure of 1 bar), by evacuating the capsule followed by pressure filling (e.g. up to 20 bar), by syringe, etc. In particular when using capillary filling or vacuum filling, it may be advantageous to have at least two openings 104.

In embodiments of the invention, the wavelength converting material to be introduced into the capsule may be provided as a wavelength converting layer coated on a carrier sheet of transparent material. In such embodiments, the opening 104 should have the shape of a slit of suitable dimensions to allow introduction of the sheet into the capsule, in the plane of the capsule. Furthermore, in such embodiments, the capsule may be filled with an inert gas before introduction of the sheet coated with the wavelength converting material.

After introduction of the wavelength converting material, the opening 104 may be sealed. The seal may be a hermetic seal. For sealing the opening 104, various techniques may be used. For example, gas-tight epoxy may be applied to seal the opening 104. Alternatively, a droplet of low melting temperature glass frit may be applied to seal the opening 104. Other examples of sealing techniques include laser melting of a small piece of ceramic (e.g. alumina) to form a seal, and ultrasonic welding of a plug or thin disc of a metal having a low melting temperature to form a seal. The material used for the seal 103 may at least partly fill the opening 104. Preferably, the material used for the seal may have low light absorption.

The wavelength converting material used in the wavelength converting member according to the invention may comprise at least one type of quantum dots.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the quantum dots. In embodiments of the present invention, the quantum dots may for example have a size in the range of from 1 to 10 nm in at least one direction. As an alternative to quantum dots, quantum rods may be used, which may have a width in the range of from 1 to 10 nm and a length of up to 1 mm or more.

Additionally, quantum dots have very narrow emission band. Presently most quantum dots with emission in the visible range are based on cadmium selenide (CdSe) with shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Any type of quantum dot known in the art may be used in the present invention, provided that it has the appropriate wavelength conversion characteristics. For example, in embodiments of the invention, quantum dots comprising CdSe, InP, $CuInS_2$, or $AgInS_2$ may be used. However, it may be preferred for reasons of environmental safety and concern to use cadmium-free quantum dots or at least quantum dots having low cadmium content.

In embodiments of the invention, the wavelength converting material may comprise an organic or inorganic phosphor, typically in addition to quantum dots. Examples of suitable organic phosphors are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170. Examples of inorganic wavelength converting materials may include, but are not limited to, cerium (Ce) doped YAG ($Y_3Al_5O_{12}$) or LuAG ($Lu_3Al_5O_{12}$). Examples of other suitable inorganic phosphors materials may include, but are not limited to ECAS (ECAS, which is $Ca_{1-x}AlSiN_3:Eu_x$ wherein $0<x\le1$; preferably $0<x\le0.2$) and BSSN (BSSNE, which is $Ba_{2-x-z}M_xSi_{5-y}Al_yN_{8-y}O_y:Eu_z$ wherein M represents Sr or Ca, $0\le x\le1$ and preferably $0\le x\le0.2$, $0\le y\le4$, and $0.0005\le z\le0.05$).

Typically, the wavelength converting material further comprises a matrix material, in which the quantum dots, and optionally any organic and/or inorganic phosphor(s), are dispersed. Preferably, the matrix material has a high degree of transparency and low light absorption. For example, the matrix material may be silicone or a polymer, such as an acrylic polymer. Advantageously, in some embodiments, a polymer or a pre-polymer (which is not fully polymerized) may be introduced into the capsule via the opening 104 in a liquid state at room temperature. It may be desirable to avoid use of solvents which would require drying or extraction via the fill hole.

In embodiments of the invention, the matrix material may be curable. In such embodiments, after introduction of the wavelength converting material into the capsule and sealing of the opening 104, the matrix material may be cured, e.g. thermally or by UV light. However, curing may also be performed before sealing of the capsule, e.g. under an inert atmosphere. Advantageously, UV curing may be performed slowly, at low temperature, which reduces shrinkage of the matrix material and gas bubble formation that may lead to an inhomogeneous wavelength converting layer. In homogeneous distribution of the wavelength converting material may result in non-uniform color appearance of a light emitting arrangement using the capsule, and even to leakage of completely non-converted light either at the position of a bubble or at the edge of the cavity. In general, color homogeneity of the emitted light and color uniformity of different parts produced is desirable.

In an embodiment of the invention where the matrix material is non-curable, it may be possible to introduce the wavelength converting material into the capsule at a higher temperature and, after introduction and sealing, allow the wavelength converting material to cool down and form a solid inside the sealed capsule. Alternatively, the wavelength converting material may be introduced as a fluid and may remain a fluid inside the capsule.

During production and/or operation, the wavelength converting member of the present invention may be exposed to high temperatures. Since the thermal expansion coefficients of the wavelength converting material and the rest of the capsule, in particular portions 101, 102 and optionally lateral portion(s) 106a-b, may be different, the wavelength converting material and the capsule may expand to different extents, resulting in stresses being built up within the wavelength converting member. Generally, the matrix of the wavelength converting material may expand more than the capsule. To avoid or at least reduce any stress resulting from differences in thermal expansion, the wavelength converting material may be applied to only partially fill the cavity within the capsule. For example, voids may be left at one or more edges of the cavity. Another alternative is to use a matrix material comprising pores, for example a matrix material having a porosity of up to 5%.

Another problem related to thermal expansion of a wavelength converting material is a color shift as the volume concentration of quantum dots is reduced due to expansion of the matrix material. In order to reduce or prevent such a color shift, in an embodiment of the invention the wavelength converting material may be applied to adhere to the interior walls of the capsule, leaving a void in the center of the capsule. Alternatively, an additional layer of matrix material without quantum dots or phosphors may be applied to form a layer adjacent to the wavelength converting material, which in combination with the shape of the cavity may be arranged to prevent the wavelength converting material to expand in the in-plane (e.g., radial) direction. Voids may be left at the edges of the cavity to allow the additional layer of matrix material to expand in the in-plane direction.

Generally, the dimensional accuracy of the sintered ceramic portions, in particular sintered alumina portions, used for forming the capsule is about 0.5-1%. Inaccuracies may arise during injection molding (hot product may deform when it is removed from the mold), or during sintering (e.g. due to local temperature differences in the oven). As a result, the dimensions of the cavity and therefore also the thickness of the layer of wavelength converting material contained therein, may vary between individual wavelength converting members. Variations in wavelength converting layer thickness may lead to undesirable variations in color temperature.

To increase the dimensional accuracy of the cavity, one solution may be to arrange spacers within the capsule. Spacers may be protruding elements arranged on, or forming part of, at least one of the portions 101, 102 of the capsule. The spacers may typically have a flat top portion which may contact the opposite portion 101, 102. In one example, protruding elements could be injection molded together with either one, or both, of the portions 101, 102. Alternatively, alumina spheres or an alumina ring could be placed between the portions 101, 102 so as to be positioned within the cavity when the portions 101, 102 are assembled.

For example, each of the portions 101, 102 illustrated in FIG. 1 could be injection molded to have a plurality of spacers protruding from the surface of the portion intended to face the interior of the capsule (the cavity). Before joining the portions 101, 102, adhesive may be applied on the top surface of at least some of the spacers, which are intended to contact the cavity-facing surface of the opposite portion 101, 102. Next, the two portions 101, 102 may be joined as described above to form the capsule, optionally by slightly pressing the portions together, followed by sintering.

For example, a disc-shaped wavelength converting member having a diameter of 16 mm may comprise five spacers, regularly distributed over the surface area of the wavelength converting member, each spacer having a height of 1 mm.

Alternatively, a gap can be defined by a sacrificial layer of organic material or metal that is removed before the final sintering process. Such a layer can be removed by e.g. dissolution in solvent, reaction (such as oxidation by firing in air), depolymerization (e.g. depolymerization of polyoxymethylene catalyzed by nitric acid vapor), or evaporation.

Another way to reduce or avoid problems with undesirable variations of color temperature due to dimensional inaccuracy of the wavelength converting material may be to adjust the wavelength converting capacity of the wavelength converting member. For example, for a wavelength converting material having a slightly smaller cavity volume, a slightly higher concentration of quantum dots and optionally organic or inorganic phosphor could be used in order to compensate for the smaller volume of wavelength converting material. Alternatively or additionally, after introduction of the wavelength converting material and sealing of the capsule, the color temperature may be measured and a small amount of organic or inorganic phosphor may be applied on an outer surface of the wavelength converting member, in any suitable distribution pattern, adapted to compensate for the difference in color temperature of the wavelength converting material within the capsule as compared to a reference.

Figure 4:
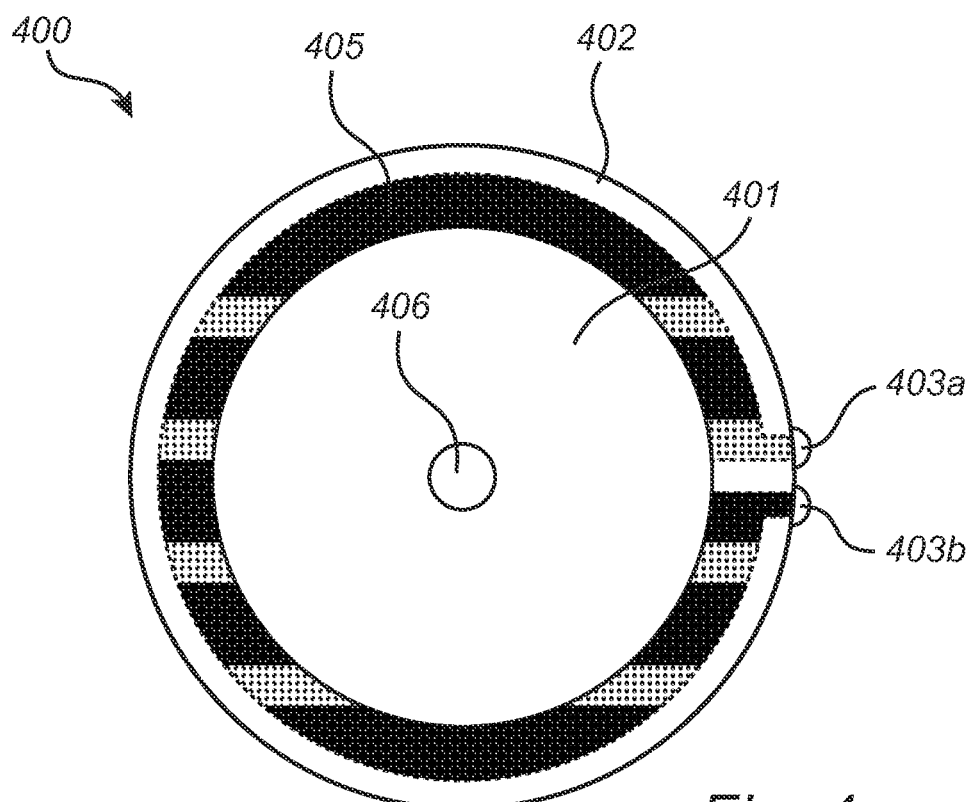
FIG. 4 shows a top view of a wavelength converting member according to an embodiment of the invention.
Figure 5:
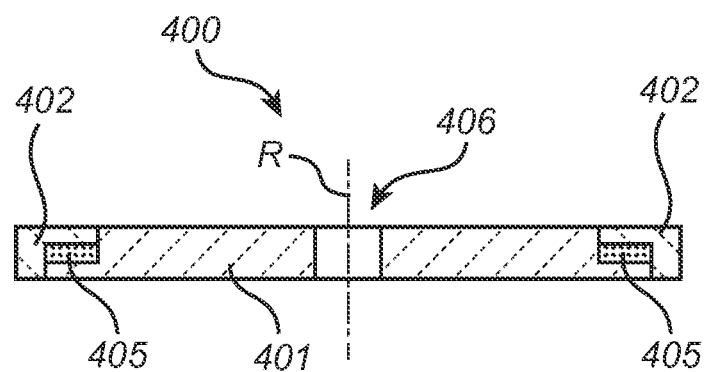
FIG. 5 is a cross-sectional side view of the wavelength converting element of FIG. 4.

FIG. 4 illustrates another embodiment of the invention, showing a top view of a disc-shaped wavelength converting member 400, and FIG. 5 illustrates a cross-sectional side view of the same. In this embodiment, a disc-shaped first portion 401 makes up most of the body of the wavelength converting member. The first portion 401 has a shoulder along its circumference. A ring-shaped second portion 402 is arranged to cover the shoulder area and thus define a cavity into which a wavelength converting material 405 may be inserted via two openings in the second portion 402. The cavity is ring-shaped except for an interruption between said openings. The openings are sealed with seals 403a, 403b (shown in FIG. 4). The wavelength converting member 400 may be mounted on a rotatable shaft, typically via a central through hole 406 made in the disc-shaped first portion 401. The wavelength converting member is then rotatable around a rotational axis R, shown in FIG. 5.

In embodiments of the invention, the wavelength converting member may be adapted to form a color wheel, e.g. for use in an image projector. A digital image projector may use a rotatable color wheel for conversion of primary light (typically blue light) from a solid state light source into a variety of secondary colors. Light emitted by the light source is typically shaped by one or more optical components (e.g. focused by a condensing lens) before reaching the color wheel. According to embodiments of the invention, a color wheel may comprise a wavelength converting member as described in more detail below. The color wheel typically comprises a plurality of segments comprising different wavelength converting materials for conversion into different colors, and may be rotated so as to position any one of the wavelength converting segments in front of the light beam, one in order to provide conversion into the desired color. The color-converted light leaving the color wheel (transmitted or reflected) may then be focused by at least one lens onto a digital micro-mirror device, before being projected (by at least one projection lens) onto a screen as an image.

Figure 6:
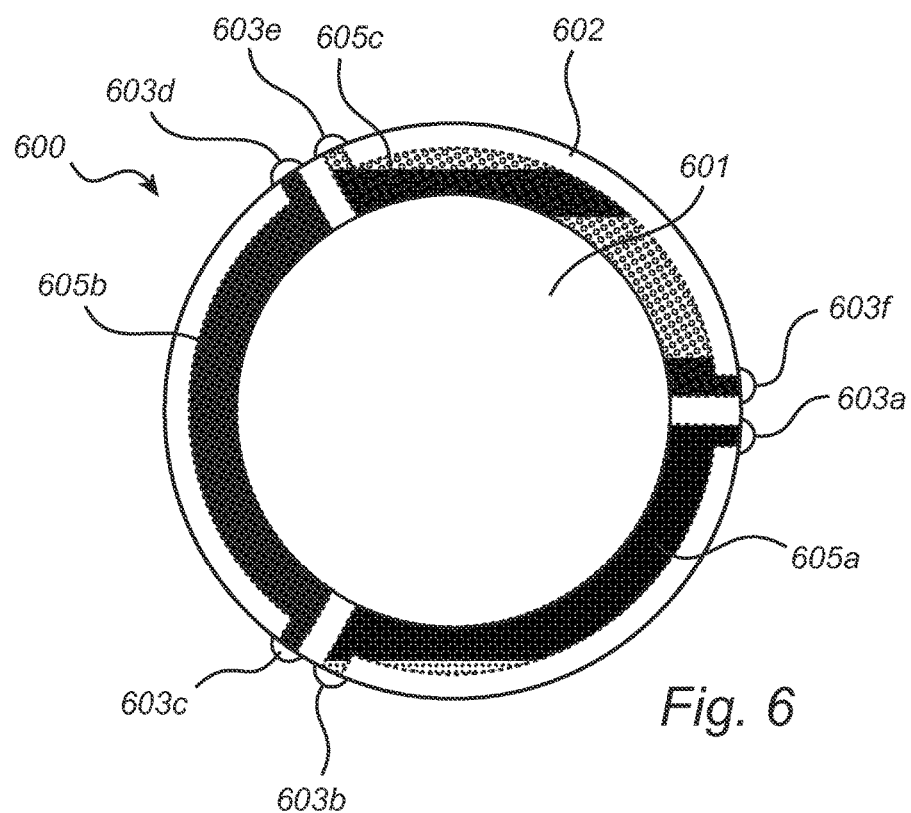
FIG. 6 is a top view of a wavelength converting element according to another embodiment of the invention, suitable for use as a color wheel.

An embodiment of a wavelength converting member particularly suitable for use as a color wheel is shown in FIG. 6. Similarly to the embodiment of FIG. 4, the wavelength converting member 600 comprises a disc-shaped first portion 601 having a shoulder along its circumference. However, the wavelength converting member 600 of this embodiment comprises a ring-shaped second portion 602 which defines a plurality of part-circular cavity segments, rather than forming a single ring-shaped cavity. The cavity segments are typically not in communication with each other. The cavity segments, filled with wavelength converting material, are denoted 605a-c in FIG. 6. Each cavity segment has at least one opening for introduction of the wavelength converting material after joining of the portions 601, 602; in the embodiment shown in FIG. 6, each cavity segment has two openings, positions marked in the figure by the presence of seals 603a-f. The cavity segments may be equal in size or may be different in size, depending on the intended application. Typically, the cavity segments may contain different wavelength converting materials. Furthermore, it is not necessary that all wavelength converting materials comprise quantum dots. For example, a first cavity segment may contain a first wavelength converting material 605a comprising a green phosphor or green quantum dots, or a mixture thereof; a second cavity segment may comprise a second wavelength converting material 605b comprising red quantum dots, a red phosphor, or a mixture thereof; and a third cavity segment may comprise a third wavelength converting material 605c comprising a yellow phosphor or yellow quantum dots. Alternatively, one of the cavity segments may be left void of wavelength converting material, in order to allow transmission of light from a light source, e.g. a blue light emitting diode.

Figure 7:
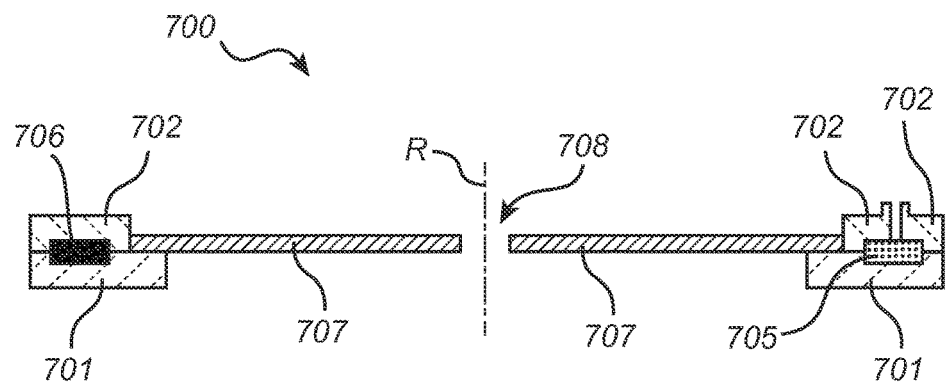
FIG. 7 is a cross-sectional side view of wavelength converting element according to another embodiment of the invention, also suitable for use as a color wheel.

FIG. 7 shows an alternative embodiment of a wavelength converting member 700 for use as a color wheel. In this embodiment, at least two different wavelength converting materials 705, 706 are contained each in a cavity segment as shown in FIG. 6. However, it is also possible to use a single wavelength converting material 705 contained within a nearly ring-shaped cavity as shown in FIGS. 4-5. The cavity or cavity segments are defined by a first ring-shaped portion 701 and a second ring-shaped portion 702 joined together as described above and thus forming a ring-shaped capsule. The portions 701, 702 are also mounted on a disc-shaped carrier 707, which may be a metal disc. As shown in FIG. 7, the carrier 707 may be provided with a central through hole 708, e.g. for mounting on a rotatable member, such as a rotatable shaft. The wavelength converting member 700 may thus be rotatable around the rotation axis R. Alternatively, instead of a through hole 708, an adaptor element could be provided on the carrier 707 for mounting e.g. on a rotatable member. Similarly, instead of the through hole 406 shown in FIGS. 4 and 5, the portion 401 could comprise a recess or be provided with (e.g. glued to) other means for mounting the wavelength converting member e.g. on a rotatable member.

The wavelength converting members 600, 700 may be substantially planar, with the rotation axis R extending in the normal direction to the plane of the wavelength converting member.

A rotatable member, e.g. a shaft, may be made of any suitable material, including sintered polycrystalline ceramic. In some embodiments, a wavelength converting member for use as a color wheel may be integral with a rotatable shaft, e.g. by injection molding a portion of the capsule, for example the portion 601 having a shaft. Alternatively, the portions of the capsule, e.g. portions 601, 601 and a rotatable shaft could be produced separately and the shaft may be inserted into a central hole and joined by a shrink fit process.

The rotatable member, e.g. shaft, is typically connected to an electrical engine to control the rotation of the color wheel.

In embodiments of the invention, in particular when intended as a color wheel, the wavelength converting member may further comprise additional optically functional layers applied onto a surface of the capsule, typically onto an outer surface (i.e. not intended to face the cavity) of the first portion 101, 401 and/or the second portion 102, 402. An example of such an optically functional layer is a reflective layer, which may be advantageous if the wavelength converting member is applied as a color wheel in a projector operating in reflective mode. Another example of such an optically functional layer is a dichroic filter, which may be provided to transmit blue light, such that primary, blue light emitted by a light source may be received and converted by the wavelength converting member, and to reflect secondary, converted light, such that any backscattered secondary, converted light may be redirected and may exit the wavelength converting member in the desired direction.

Figure 8:
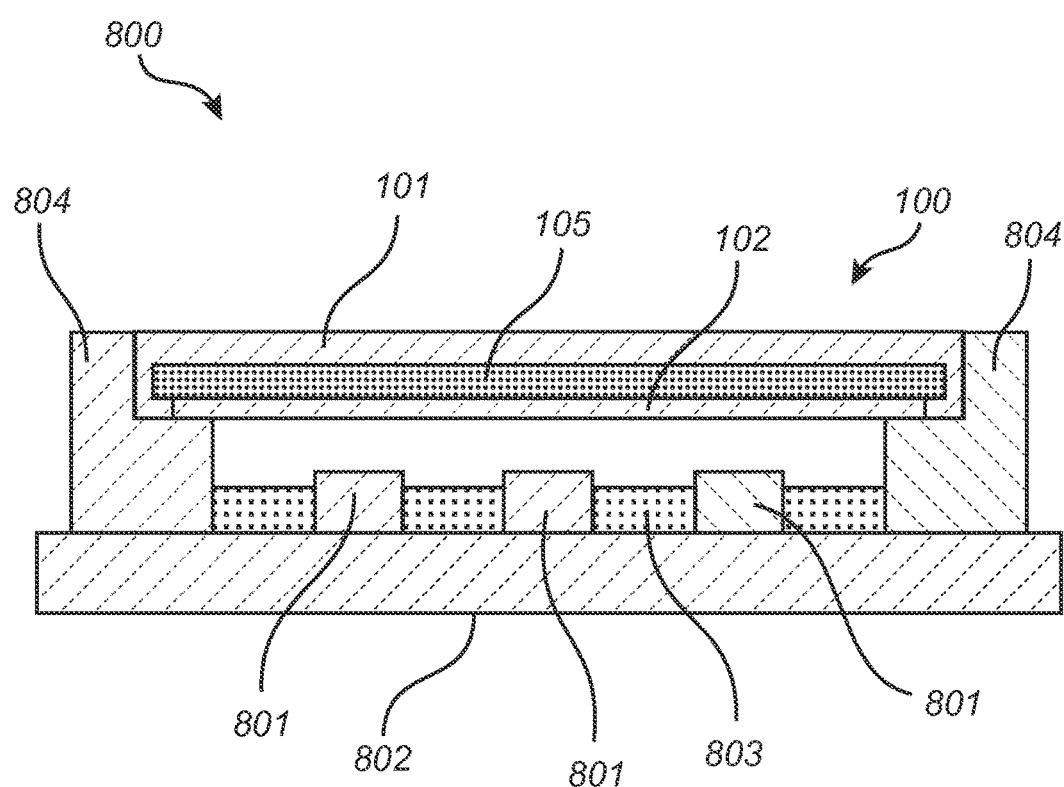
FIG. 8 is a cross-sectional side view of a light emitting arrangement according to embodiments of the invention.

As mentioned above, in embodiments of the invention the wavelength converting member may be adapted to form a light exit window of a light emitting arrangement employing a solid state light source. FIG. 8 illustrates a light emitting arrangement 800 comprising a plurality of solid state light sources 801, typically light emitting diodes, arranged on a printed circuit board 802. A reflective material 803 may be provided between and around the light sources 801. The light sources 801 are surrounded by at least one reflective wall 804, which also acts to support a light exit window corresponding to a wavelength converting member 100 as described above with reference to FIG. 1. During operation, primary light emitted by the light sources 801 is transmitted through the portion 102 of the wavelength converting member 100, is received and at least partially converted into secondary light by the wavelength converting material. Secondary light, and primary light that is not converted, is subsequently transmitted via the portion 101 of the wavelength converting member and thus may exit the light emitting arrangement.

The solid state light sources used may be LEDs or laser diodes. In some embodiments the solid state light source may be a blue light emitting LED, such as GaN or InGaN based LED, for example emitting primary light of the wavelength range from 440 to 460 nm. Alternatively, the solid state light source may emit UV or violet light which is subsequently converted into light of longer wavelength(s) by one or more wavelength converting materials. Furthermore, although FIG. 8 shows a plurality of light sources, it is contemplated that a light emitting arrangement according to embodiments of the invention may comprise a single light source.

Light emitting arrangement according to embodiments of the invention may be adapted for a variety of applications. For example the light emitting arrangement may be used in a flash light for a camera, in a flash light (torch), or in a backlight for a display.

The person skilled in the art realizes that the present invention by no means is limited to the preferred embodiments described above. On the contrary, many modifications and variations are possible within the scope of the appended claims. For example, the capsule may be provided with a surface structure on at least one of the portions, on an outer surface thereof and/or on an inner surface (i.e., facing the cavity) thereof. Outer surface structures may for example be applied in order to modify the optical properties of the capsules, whereas inner surface structures may improve the flow of the wavelength converting material (including carrier) during the process of filling the capsule.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A wavelength converting member comprising:
    a sealed capsule, the sealed capsule comprising sintered polycrystalline ceramic, the capsule defining at least one sealed cavity, the capsule having a thickness and at least one edge;
    an opening in the capsule through which the wavelength converting material was introduced into the capsule prior to being sealed, the opening having a width less than a width of the at least one edge of the capsule;
    a seal material blocking the opening after the cavity was filled with the wavelength converting material, the opening having the same dimensions after sealing as before sealing; and
    a wavelength converting material contained within the sealed cavity,
    wherein said sealed capsule defines a plurality of individual, sealed cavities containing a plurality of wavelength converting materials forming a color wheel in a digital image projector, wherein each sealed cavity include different wavelength converting materials and the color wheel is rotatable around a rotation axis, the rotation axis extending in the normal direction to a plane of the color wheel.

2. A wavelength converting member according to claim 1, wherein said polycrystalline ceramic is doped with $ZrO_2$ and/or MgO.

3. A wavelength converting member according to claim 1, wherein said wavelength converting material comprises quantum dots.

4. A wavelength converting layer according to claim 1, wherein the wavelength converting material is mixed with a carrier material.

5. A wavelength converting member according to claim 4, wherein the carrier material comprises pores.

6. A wavelength converting material according to claim 1, wherein said wavelength converting material and any carrier material does not completely fill said sealed cavity.

7. A wavelength converting member according to claim 1, further comprising at least one spacer arranged within the sealed capsule.

8. A wavelength converting member according to claim 1, wherein said sealing material is selected from the group consisting of epoxy, glass frit, alumina, and metal.

9. A wavelength converting member according to claim 1, wherein the sealed capsule is hermetically or pseudo-hermetically sealed.

10. A wavelength converting member according to claim 1, wherein the sintered polycrystalline ceramic is sintered polycrystalline alumina.

* * * * *